(12) United States Patent
Asai

(10) Patent No.: US 10,373,919 B2
(45) Date of Patent: Aug. 6, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Tatsuhiko Asai, Hino (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/666,534

(22) Filed: Aug. 1, 2017

(65) Prior Publication Data

US 2018/0076149 A1   Mar. 15, 2018

(30) Foreign Application Priority Data

Sep. 14, 2016   (JP) .................. 2016-180035

(51) Int. Cl.
*H01L 21/56* (2006.01)
*H01L 23/00* (2006.01)
(Continued)

(52) U.S. Cl.
CPC ........ *H01L 23/562* (2013.01); *H01L 21/4853* (2013.01); *H01L 21/565* (2013.01); *H01L 23/3121* (2013.01); *H01L 23/367* (2013.01); *H01L 23/3735* (2013.01); *H01L 23/49844* (2013.01); *H01L 24/37* (2013.01);
(Continued)

(58) Field of Classification Search
CPC . H01L 23/562; H01L 21/4853; H01L 21/565; H01L 23/3121; H01L 23/367; H01L 23/492; H01L 23/49844; H01L 24/32; H01L 24/40; H01L 24/48; H01L 24/73; H01L 24/83; H01L 24/84; H01L 24/85; H01L 24/92

See application file for complete search history.

(56) References Cited

U.S. PATENT DOCUMENTS

2008/0303056 A1* 12/2008 Ward .................... H01L 24/40
                                                                257/133
2008/0311360 A1* 12/2008 Kitagawa ............ H01L 23/498
                                                                428/209

(Continued)

FOREIGN PATENT DOCUMENTS

JP   2011-199039 A   10/2011
JP   2012-156450 A    8/2012
JP   2015-142072 A    8/2015

*Primary Examiner* — Fernando L Toledo
*Assistant Examiner* — Neil R Prasad
(74) *Attorney, Agent, or Firm* — Rabin & Berdo, P.C.

(57) ABSTRACT

A semiconductor device including a stacked assembly. The stacked assembly includes a metal substrate, a stacked substrate mounted on the metal substrate and having an electrode pattern, a semiconductor element mounted on the stacked substrate, and a lead frame interconnection electrically connecting the semiconductor element and the electrode pattern. The lead frame interconnection includes a first bonding portion in contact with the semiconductor element, a second bonding portion in contact with the electrode pattern, and an interconnect portion connecting the first and second bonding portions. At least one of the first bonding portion and the second bonding portion is wider than the interconnect portion.

6 Claims, 8 Drawing Sheets

(51) Int. Cl.
    *H01L 21/48*     (2006.01)
    *H01L 23/31*     (2006.01)
    *H01L 23/367*     (2006.01)
    *H01L 23/498*     (2006.01)
    *H01L 23/373*     (2006.01)
    *H01L 23/492*     (2006.01)
    *H01L 23/053*     (2006.01)
    *H01L 23/24*     (2006.01)

(52) U.S. Cl.
    CPC .............. H01L 24/40 (2013.01); H01L 24/84 (2013.01); *H01L 23/053* (2013.01); *H01L 23/24* (2013.01); *H01L 23/492* (2013.01); *H01L 23/49811* (2013.01); *H01L 24/29* (2013.01); *H01L 24/32* (2013.01); *H01L 24/48* (2013.01); *H01L 24/73* (2013.01); *H01L 24/83* (2013.01); *H01L 24/85* (2013.01); *H01L 24/92* (2013.01); *H01L 2224/29111* (2013.01); *H01L 2224/29113* (2013.01); *H01L 2224/29147* (2013.01); *H01L 2224/32225* (2013.01); *H01L 2224/32227* (2013.01); *H01L 2224/37013* (2013.01); *H01L 2224/40095* (2013.01); *H01L 2224/40225* (2013.01); *H01L 2224/40227* (2013.01); *H01L 2224/451* (2013.01); *H01L 2224/48091* (2013.01); *H01L 2224/48106* (2013.01); *H01L 2224/48175* (2013.01); *H01L 2224/73221* (2013.01); *H01L 2224/73263* (2013.01); *H01L 2224/73265* (2013.01); *H01L 2224/83447* (2013.01); *H01L 2224/83801* (2013.01); *H01L 2224/84447* (2013.01); *H01L 2224/84801* (2013.01); *H01L 2924/014* (2013.01); *H01L 2924/1203* (2013.01); *H01L 2924/13055* (2013.01); *H01L 2924/181* (2013.01); *H01L 2924/3511* (2013.01)

(56) References Cited

U.S. PATENT DOCUMENTS

| | | | |
|---|---|---|---|
| 2012/0025227 A1* | 2/2012 | Chan | H01L 33/62 257/89 |
| 2013/0069215 A1* | 3/2013 | Nakao | H01L 23/049 257/687 |
| 2014/0306330 A1* | 10/2014 | Williams | H01L 23/49541 257/675 |
| 2015/0214139 A1 | 7/2015 | Miyakawa | |

* cited by examiner

FIG.6

| L2/L1 | STRAIN REDUCTION (%) | FATIGUE LIFE |
|---|---|---|
| 1 | 0 | <100000 |
| 1.1 | 15% | ≒100000 |
| 1.2 | 30% | >100000 |
| 1.5 | 40% | >100000 |

SEMICONDUCTOR DEVICE AND METHOD OF MANUFACTURING SEMICONDUCTOR DEVICE

CROSS REFERENCE TO RELATED APPLICATIONS

This application is based upon, and claims the benefit of priority of, the prior Japanese Patent Application No. 2016-180035, filed on Sep. 14, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

A power semiconductor module is a power semiconductor device having one or more built-in power semiconductor chips, partially or entirely configuring a conversion connection and having a structure electrically insulated between the power semiconductor chip(s) and a stacked substrate or metal substrate. In terms of industrial applications, power semiconductor modules are used in, for example, motor driving control inverters for elevators and the like. In recent years, power semiconductor modules have come to be widely used in motor driving control inverters for automotive use. To improve fuel efficiency, automotive inverters have to be compact and light-weight. Further, since automotive inverters are installed near the drive motor in the engine room, long-term reliability at high operating temperatures is also demanded of these inverters.

A structure of a typical insulated gate bipolar transistor (IGBT) power semiconductor module will be described as an example of a structure of a conventional power semiconductor module.

FIG. 7 is a cross-sectional view of a conventional structure of a power semiconductor module. As depicted in FIG. 7, a power semiconductor module includes a power semiconductor chip 1, an insulating substrate 2, bonding members 3b, 3c, an electrode pattern 4, a metal substrate 5, a terminal case 7, a sealing resin 8, a metal terminal 9, a metal wire 10, and a cover 11.

The power semiconductor chip 1 is a semiconductor element such as an IGBT or a diode chip, etc. Both sides of the insulating substrate 2 have the electrode pattern 4. On the electrode pattern 4 on one side, the power semiconductor chip 1 is bonded by the bonding member 3b of, for example, solder. On the electrode pattern 4 on the other side, the metal substrate 5 having a radiator fin (not depicted) is bonded by the bonding member 3c of, for example, solder. A substrate in which an electrode pattern is provided on at least one surface of the insulating substrate 2 is called a stacked substrate. Further, as wiring for electrical connection, the metal wire 10 is connected to an upper surface of the power semiconductor chip 1 and the electrode pattern 4. The metal terminal 9 for external connection is provided on an upper surface of the electrode pattern 4. Further, to insulate and protect the power semiconductor chip 1, the terminal case 7 is filled with the sealing resin 8, e.g., silicone gel of a low elastic modulus, and a package is completed by the cover 11.

Compared to power semiconductor modules for industrial use, power semiconductor modules for automotive use have to be compact and light-weight due to installation space constraints. Further, since the output power density to drive the motor becomes high, the semiconductor chip temperature during operation becomes high and accordingly, demand for long-term reliability at high operating temperatures is high. Therefore, a power semiconductor module structure providing long-term reliability and high temperature operation is demanded.

Nonetheless, with a conventional metal-wire wiring scheme using metal wire, the gauge of the wire affects current density at the time of energization and to provide the current necessary for operation, the number of wires has to be increased. Therefore, with the metal-wire wiring scheme, the upper surface of the semiconductor chip and the electrode pattern have to be connected by multiple metal wires and the wire bonding area of the power semiconductor module increases whereby the size of the power semiconductor module itself increases.

Thus, to resolve these issues, a switch to a lead frame interconnect scheme from the conventional metal-wire wiring scheme is being studied. A lead frame interconnect scheme involves using a lead frame interconnection formed by a metal plate molding process, supporting and fixing the semiconductor chip, and connecting the semiconductor chip and the electrode pattern.

Further, compared to conventional power semiconductor modules for industrial use, power semiconductor modules for automotive use have a high operating temperature and therefore, with a conventional silicone gel sealed structure, heat resistance becomes a problem and therefore, a sealing resin structure using a thermosetting resin such as an epoxy resin is being studied.

With regard to the lead frame interconnect scheme, for example, one semiconductor device includes a first lead frame, a second lead frame provided apart from the first lead frame, a semiconductor chip provided on the first lead frame, resin sealing the semiconductor chip, and a connector (for example, refer to Japanese Laid-Open Patent Publication No. 2015-142072). Further, another semiconductor device includes a lead frame that is a first interconnection connected to a first main electrode, a wire frame that is a second interconnection connected to a second main electrode, and a lead frame that is a third interconnection connected to a control electrode (for example, refer to Japanese Laid-Open Patent Publication No. 2011-199039). Further, another semiconductor device includes a semiconductor element, a lead frame that is a terminal member in which one end Ei portion is bonded to the semiconductor element and another end Ex is electrically connected to an external device, and a sealing body sealing 1 sealing the one end Ei portion of the terminal member and the semiconductor element (for example, refer to Japanese Laid-Open Patent Publication No. 2012-156450).

SUMMARY OF THE INVENTION

According to one aspect of the present invention, a semiconductor device includes a resin case in combination with a stacked assembly including: a semiconductor element; a stacked substrate on which an electrode pattern is provided and the semiconductor element is mounted; a lead frame interconnection electrically connecting the semiconductor element and the electrode pattern; and a metal substrate on which the stacked substrate is mounted. The lead frame interconnection is constituted by a first bonding portion in contact with the semiconductor element, a second bonding portion in contact with the electrode pattern, and an interconnect portion connecting the first and second bonding portions. The first and second bonding portions have a width that is wider than a width of the interconnect portion.

In the semiconductor device, the interconnect portion is connected to the first and second bonding portions at a position away from ends of the first and the second bonding portions.

In the semiconductor device, the width of the interconnect portion is narrower than a width by which a lifespan targeted for the semiconductor device is achieved.

In the semiconductor device, the width of the first and the second bonding portions is 20% wider than the width of the interconnect portion, or more.

According to another aspect of the present invention, a method of manufacturing a semiconductor device, includes assembling a stacked assembly by mounting a semiconductor element on a stacked substrate and mounting the stacked substrate on a metal substrate; electrically connecting the semiconductor element and an electrode pattern on the stacked substrate by a lead frame interconnection; and combining a resin case with the stacked assembly. The lead frame interconnection is constituted by a first bonding portion in contact with the semiconductor element, a second bonding portion in contact with the electrode pattern, and an interconnect portion connecting the first and the second bonding portions. The first and the second bonding portions have a width that is wider than a width of the interconnect portion.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 6 is a table indicating the relationship of a width ratio of an interconnect portion (L2/L1), strain reduction, and fatigue life in the embodiment;

DETAILED DESCRIPTION OF THE INVENTION

Figure 1:
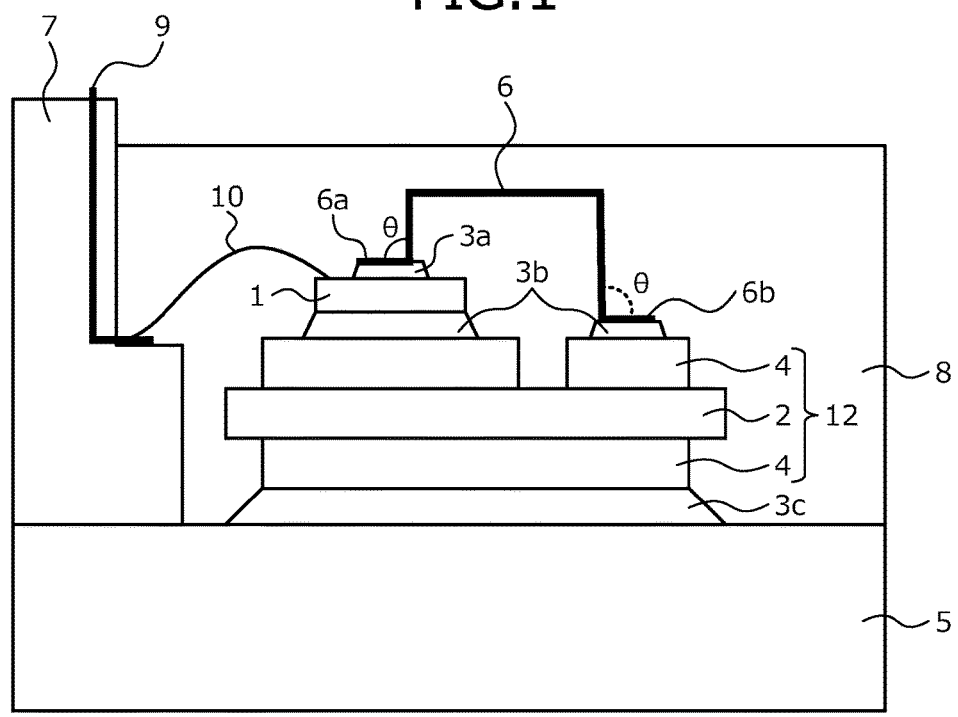
FIG. 1 is a cross-sectional view of a power semiconductor module according to an embodiment.

Embodiments of a semiconductor device and a method of manufacturing a semiconductor device will be described in detail with reference to the accompanying drawings. FIG. 1 is a cross-sectional view of a power semiconductor module according to an embodiment.

As depicted in FIG. 1, the power semiconductor module includes the power semiconductor chip 1, the insulating substrate 2, the bonding members 3a, 3b, 3c, the electrode pattern 4, the metal substrate 5, a lead frame interconnection 6, the terminal case 7, the sealing resin 8, the metal terminal 9, and the metal wire 10.

The power semiconductor chip 1 is a semiconductor element such as an IGBT or a diode chip, etc. On a front surface (side facing the power semiconductor chip 1) and a rear surface (side facing the metal substrate 5) of the insulating substrate 2 such as a ceramic substrate ensuring insulation, the electrode pattern 4 constituted by a copper (Cu) plate or the like is provided. Here, a stacked substrate 12 is assumed to be a substrate in which the electrode pattern 4 is provided on at least one side of the insulating substrate 2. On the front surface of the electrode pattern 4, the power semiconductor chip 1 is bonded by the bonding member 3b of solder, etc. On the rear surface of the electrode pattern 4, the metal substrate 5 having a radiator fin (not depicted) is bonded by the bonding member 3c of solder, etc. Further, as an interconnection for electrical connection, one end of the lead frame interconnection 6 is bonded to the upper surface (surface on side opposite a side adjacent to the bonding member 3b) of the power semiconductor chip 1 by the bonding member 3a of solder, etc. The other end of the lead frame interconnection 6 is bonded to the electrode pattern 4 by the bonding member 3b.

Here, the bonding members 3a, 3b may be a soft solder such as a Tin (SN)-copper type, a Sn-bismuth (Bi) type, etc. The reason for this is that stress applied to a bonding portion of the lead frame interconnection 6 may be mitigated by such solders. The bonding portion of the lead frame interconnection 6 is a portion where a bonding portion 6a described hereinafter is in contact with the power semiconductor chip 1.

The terminal case (resin case) 7 is combined with a stacked assembly of the power semiconductor chip 1, the stacked substrate 12, and the metal substrate 5. For example, the terminal case 7 and the stacked assembly are adhered to each other by an adhesive such as silicone. Further, to insulate and protect the power semiconductor chip 1 on the stacked substrate 12, the terminal case 7 is filled with the sealing resin 8, e.g., a hard resin such as an epoxy resin. In the embodiment, a hard resin such as an epoxy resin is used as the sealing resin 8 and no cover is used. Further, the metal wire 10 is connected between the power semiconductor chip 1 and the metal terminal 9. The metal terminal 9 penetrates and protrudes outside the terminal case 7.

Figure 2A:
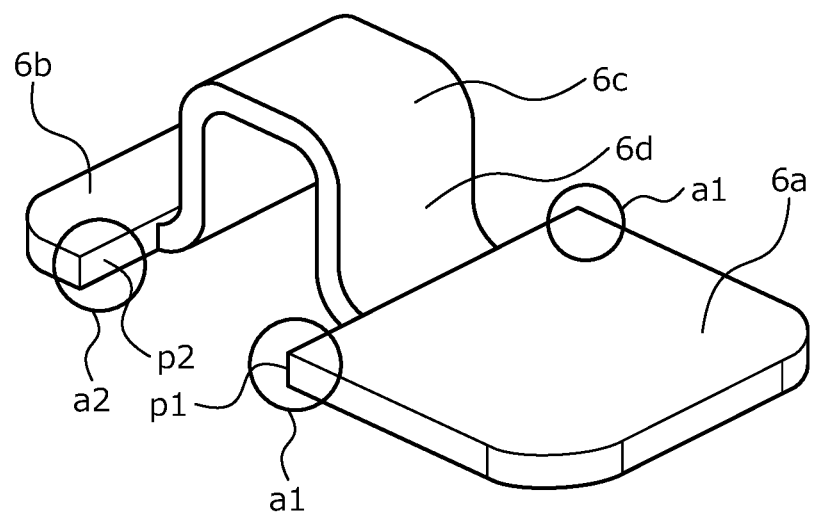
FIG. 2A is a perspective view of a shape of a lead frame interconnection according to the embodiment.
Figure 2B:
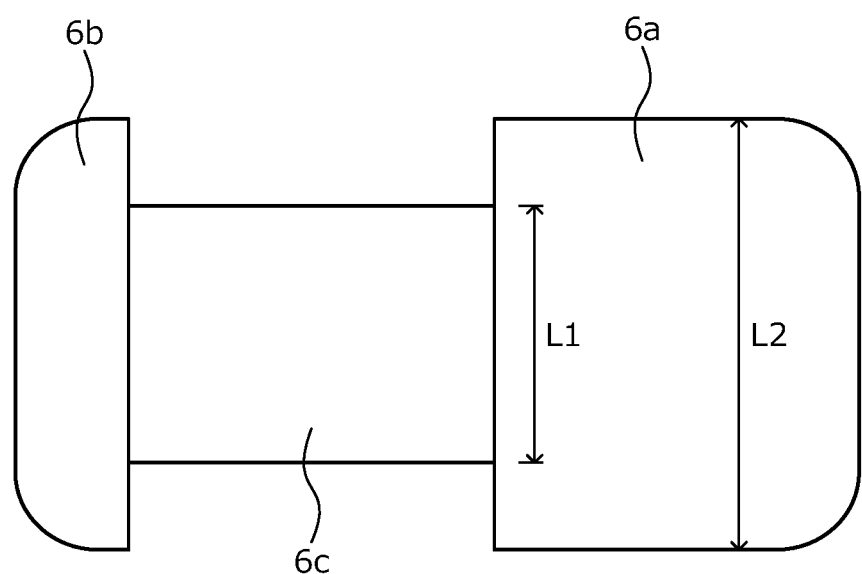
FIG. 2B is a top view of the shape of the lead frame interconnection according to the embodiment.

FIG. 2A is a perspective view of a shape of the lead frame interconnection 6 according to the embodiment. FIG. 2B is a top view of the shape of the lead frame interconnection 6 according to the embodiment. As depicted in FIG. 2A, the lead frame interconnection 6 is constituted by the bonding portion 6a (a first bonding portion) bonded to the power semiconductor chip 1 by the bonding member 3a, the bonding portion 6b (a second bonding portion) bonded to the electrode pattern 4 on the front surface by the bonding member 3b, and an interconnect portion 6c connecting the bonding portion 6a and the bonding portion 6b. In the interconnect portion 6c, a portion orthogonal to the bonding portions 6a, 6b may be called a raised portion 6d.

Here, as depicted in FIG. 2B, a width L2 of the bonding portions 6a, 6b is wider than a width L1 of the interconnect portion 6c. For example, the width L2 of the bonding portions 6a, 6b is 20% wider than the width L1 of the interconnect portion 6c or more. In other words, $L2 \geq 1.2 \times L1$ is satisfied. The interconnect portion 6c is connected to the bonding portion 6a at a position a predetermined distance from an end (for example, a1 in FIG. 2A) of a side p1 of the bonding portion 6a facing the bonding portion 6b. Further, the interconnect portion 6c is connected to the bonding portion 6b at a position a predetermined distance from an end (for example, a2 in FIG. 2A) of a side p2 of the bonding portion 6b facing the bonding portion 6a. In other words, both ends of the interconnect portion 6c are shortened by the same amount, having a shape connecting a central portion of the side p1 of the bonding portion 6a and a central portion of the side p2 of the bonding portion 6b. In particular, the interconnect portion 6c has a shape connecting the interconnect portion 6c and the bonding portions 6a, 6b at the central portions thereof with respect to width. When the lead frame interconnection is created from a rectangular plate, the width of the interconnect portion 6c is reduced by removing the same amount from each end. The location where the interconnect portion 6c connects to the bonding portions 6a, 6b is not limited to a shape connecting central portions of the sides. In other words, the bonding portions 6a, 6b may be chamfered to round-off the corners, the corners may be cut, etc.

Figure 3A:
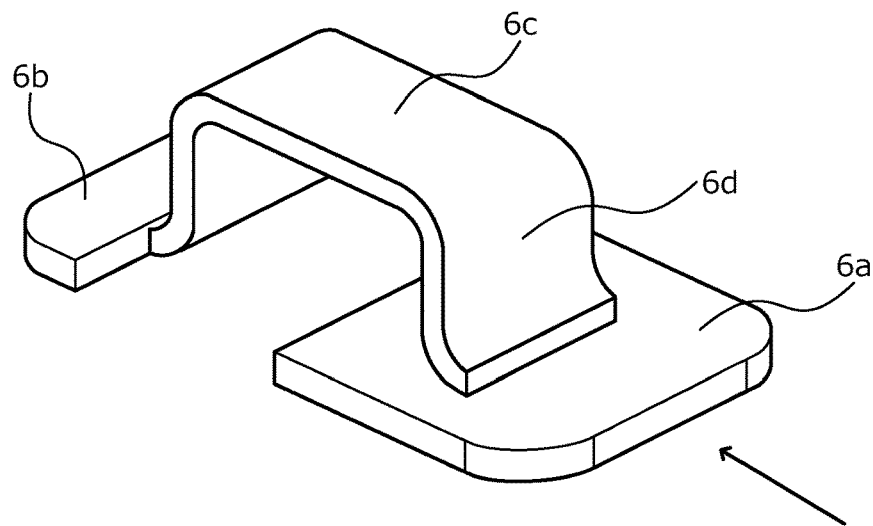
FIG. 3A is a perspective view of another shape of the lead frame interconnection according to the embodiment.
Figure 3B:
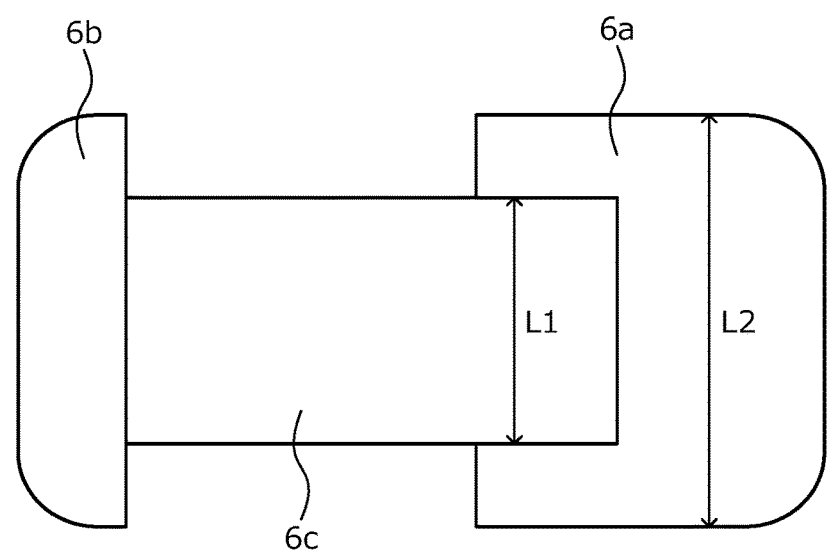
FIG. 3B is a top view of the lead frame interconnection according to the embodiment.

FIG. 3A is a perspective view of another shape of the lead frame interconnection 6 according to the embodiment. FIG. 3B is a top view of the lead frame interconnection 6 according to the embodiment. As depicted in FIG. 3A, the interconnect portion 6c may be connected to the bonding portion 6a at a central portion of an upper surface (surface on a side opposite a side facing the bonding member 3a) of the bonding portion 6a. Further, the interconnect portion 6c may be connected to another portion if not in contact with an end of the bonding portion 6a. Here, the end is a peripheral portion away from the central portion of the upper surface of the bonding portion 6a. Further, although not depicted, the interconnect portion 6c may be connected to the bonding portion 6b, at a central portion of an upper surface (surface on side opposite a side facing the bonding member 3b) of the bonding portion 6b. Further, the interconnect portion 6c may be connected to another portion if not in contact with an end of the bonding portion 6b. Further, the lead frame interconnection 6, for example, may include copper and may have a thickness of about 0.5 mm because when the lead frame interconnection 6 is made thin, the current density decreases.

Figure 4A:
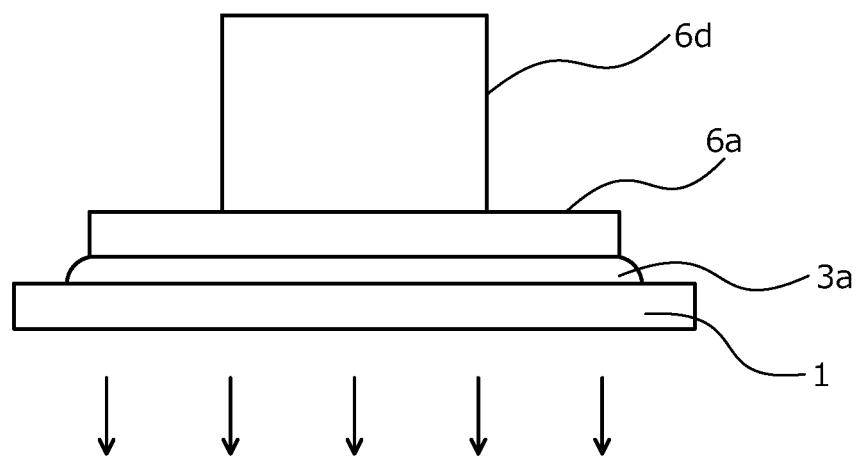
FIG. 4A is a side view of the lead frame interconnection according to the embodiment before deformation.
Figure 4B:
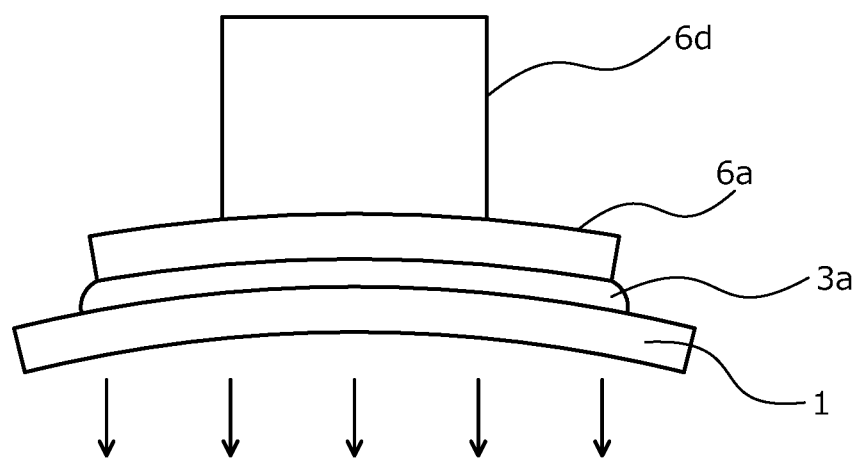
FIG. 4B is a side view of the lead frame interconnection according to the embodiment after the deformation.

Here, an ability of the lead frame interconnection 6 according to the embodiment to reduce the stress applied to the upper surface of the power semiconductor chip 1 will be described. FIG. 4A is a side view of the lead frame interconnection 6 according to the embodiment before deformation. FIG. 4B is a side view of the lead frame interconnection 6 according to the embodiment after the deformation. FIGS. 4A and 4B are drawings of the lead frame interconnection 6 as viewed from a direction where the raised portion 6d assumed as a front aspect (from the direction indicated by an arrow in FIG. 3A).

Consequent to the heat generated by the power semiconductor chip 1 during operation, thermal deformation occurs near the power semiconductor chip 1. As depicted in FIG. 4A, as a result of this thermal deformation, in the power semiconductor chip 1, a downward pulling force (indicated by arrows in FIG. 4A) acts on the lead frame interconnection 6. In other words, the power semiconductor chip 1, in FIG. 4A, is urged to deform upwardly in a convex shape. Here, in the lead frame interconnection 6 according to the embodiment, the interconnect portion 6c connects the central portions of the bonding portions 6a, 6b. Therefore, as depicted in FIG. 4B, the end portions of the bonding portions 6a, 6b may be deformed downwardly, enabling a concentration of stress applied to the end portions of the bonding portions 6a, 6b consequent to thermal deformation to be mitigated.

Figure 5:
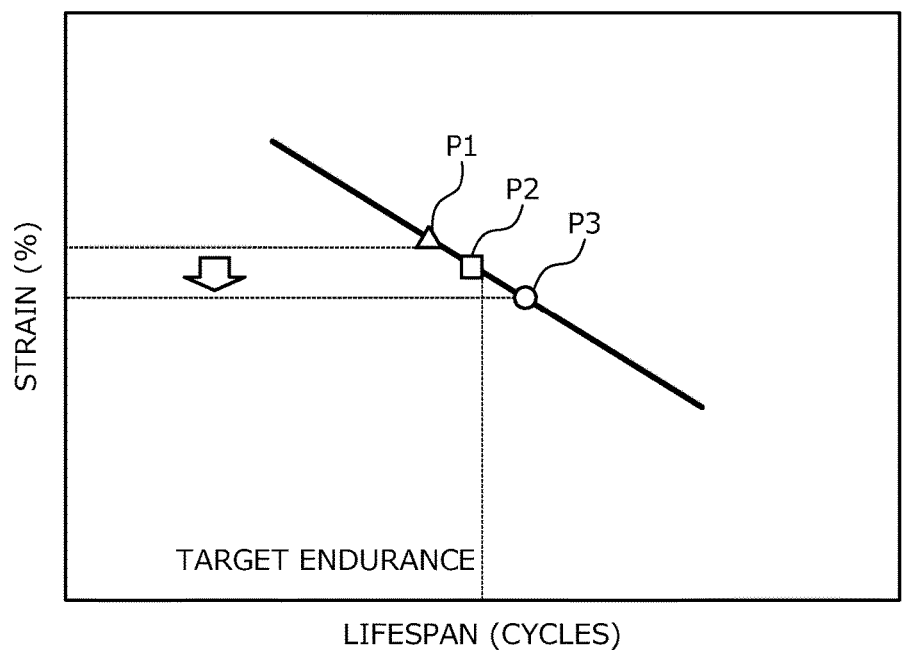
FIG. 5 is a graph of the relationship of strain and lifespan in the power semiconductor module.
Figure 7:
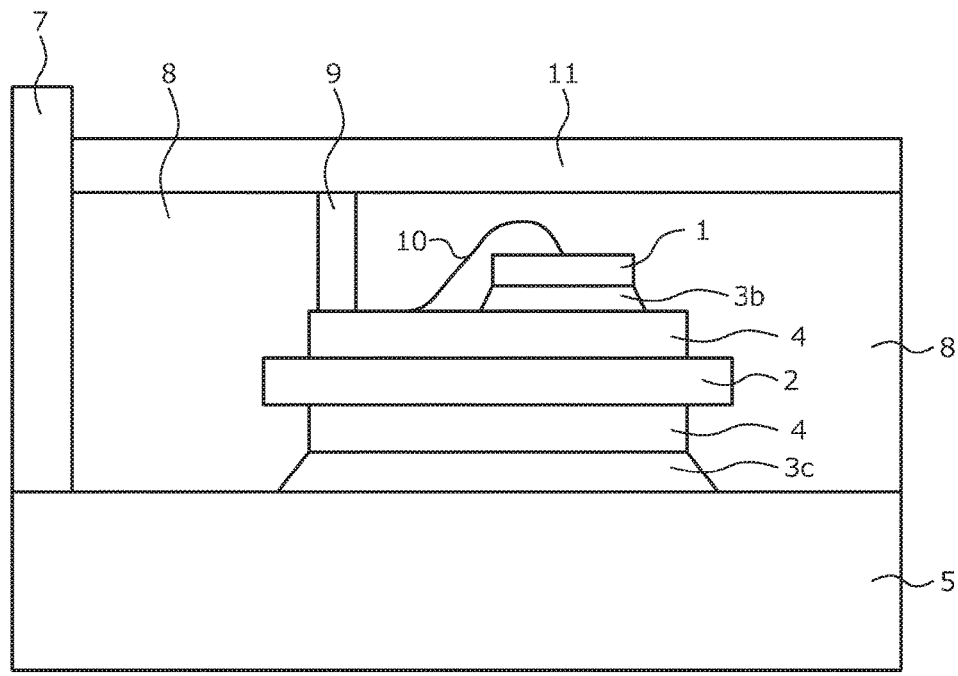
FIG. 7 is a cross-sectional view of a conventional structure of a power semiconductor module.

An ability of the lead frame interconnection 6 according to the embodiment to reduce necessary stress to achieve reliability of the power semiconductor module will be described. FIG. 5 is a graph of the relationship of strain and lifespan in the power semiconductor module. Here, strain was obtained by simulating the maximum strain occurring in an electrode on the upper surface of a semiconductor chip in a power cycle test. In FIG. 5, the horizontal axis represents fatigue life in a power cycle test of the power semiconductor module. In particular, the fatigue life is a count of repetitions of a test repeatedly performed with respect to the power semiconductor module until the power semiconductor chip 1 fails. In the test, the temperature difference for powering ON and OFF was about 135 degrees C. In particular, the temperature was raised from 40 degrees C. to 175 degrees C. in 5 minutes and held for 10 minutes, constituting one cycle.

Here, a target endurance indicated in FIG. 5 is a targeted lifespan necessary to achieve reliability of the power semiconductor module. For example, the target endurance is 100,000 times. Further, in FIG. 5, the vertical axis represents strain occurring at an upper portion of the power semiconductor chip 1. In particular, strain is an extent of vertical and horizontal change (differential expansion) at the upper portion of the power semiconductor chip 1 at the time of low temperature and at the time of high temperature.

In FIG. 5, a point P1 represents a case in which the width of the interconnect portion 6c is the same as the width of the bonding portions 6a, 6b, i.e., a case in which the lead frame interconnection 6 for which L2=L1 is used. A point P2 represents a case in which the width of the bonding portions 6a, 6b is 10% wider than the width of the interconnect portion 6c, i.e., a case in which the lead frame interconnection 6 for which L2=1.1× L1 is used. Further, a point P3 represents a case in which the width of the bonding portions 6a, 6b is 20% wider than the width of the interconnect portion 6c, i.e., a case in which the lead frame interconnection 6 for which L2=1.2×L1 is used. In this manner, it is found that strain decreases and the lifespan of the power semiconductor chip 1 increases the wider the width of the bonding portions 6a, 6b is relative to the width of the interconnect portion 6c, or in other words, the narrower the width of the interconnect portion 6c is relative to the width of the bonding portions 6a, 6b is. For example, by setting the width of the bonding portions 6a, 6b to be 20% wider than the width of the interconnect portion 6c or more, the strain may be reduced 30% or more as compared to a case in which the width of the width of the interconnect portion 6c is the same as the width of the bonding portions 6a, 6b.

Therefore, in the power semiconductor module of the embodiment, the width of the interconnect portion 6c is set to be narrower than the width of the bonding portions 6a, 6b so that the lifespan until the power semiconductor chip 1 fails becomes longer than the target endurance. In particular, at the point P1, the lifespan is shorter than the target endurance and reliability of power semiconductor module is not achieved. At the point P2, although the target endurance is substantially achieved, at the point P3, the lifespan is longer than the target endurance and reliability of the power semiconductor module is achieved. Further, FIG. 6 is a table indicating the relationship of a width ratio of the interconnect portion (L2/L1), strain reduction, and fatigue life in the embodiment. Here, L2/L1 in FIG. 6 is a ratio of the width L2 of the bonding portions 6a, 6b with respect to the width L1 of the interconnect portion 6c. Further, strain reduction (%) is the percentage of strain reduced relative to the strain when L2/L1=1. Fatigue life is the same as the fatigue life in the power cycle test of power semiconductor module in the FIG. 5. FIG. 6 depicts results when L2/L1 is varied from 1 to 1.5. As depicted in FIG. 6, by setting the width of the bonding portions 6a, 6b to be wider than the width of the interconnect portion 6c, the strain may be reduced. In one embodiment, the width of the bonding portions 6a, 6b may be set to be 10% wider than the width of the interconnect portion 6c and, preferably, may be set to be wider by 20% or more. Here, the plate thickness of the interconnect portion 6c may be in a range satisfying lead frame rigidity and current density and may be 0.2 mm to 2 mm, and preferably, from 0.5 mm to 1 mm. FIG. 5 is for a case in which the plate thickness of the lead frame interconnection 6 is about 0.5 mm. However, even when the plate thickness is varied, the results do not change. In other words, irrespective of the plate thickness of the lead frame interconnection 6, by setting the width of the bonding portions 6a, 6b to be 20% wider than the width of the interconnect portion 6c or more, strain is reduced, enabling reliability of the power semiconductor module to be achieved.

In this manner, by setting the width of the bonding portions 6a, 6b to be 20% wider than the width of the interconnect portion 6c, lifespan until the power semiconductor chip 1 fails may be made longer than the target endurance. Further, the narrower the width of the interconnect portion 6c is set, the longer the lifespan becomes. However, current flows through the interconnect portion 6c at the time of energization and therefore, the width of the interconnect portion 6c is set to be at least a width enabling a necessary area to be ensured for flow of the current at the time of energization. For example, the width of the interconnect portion 6c is set to be wider than 50% of the width of the bonding portions 6a, 6b. The respective areas of the bonding portions 6a, 6b are each set to be a necessary area for soldering the power semiconductor chip 1 and the electrode pattern 4 on the front surface. Therefore, in the embodiment, the current density may be ensured by the lead frame interconnection 6 at the time of energization.

Further, at the lead frame interconnection 6, an angle θ (refer to FIG. 1) formed by the bonding portions 6a, 6b and the interconnect portion 6c may be 90 degrees. The angle θ may be preferably at least 90 degrees±10 degrees and more preferably, 90 degrees±2 degrees. The reason for this is that when the angle θ is large, portions where the interconnect portion 6c and the bonding portions 6a, 6b contact, that is, at these corner portions of the lead frame interconnection 6, the solder becomes thin and the stress that can be absorbed by the solder decreases whereby the lifespan of the power semiconductor module decreases.

A method of manufacturing such a power semiconductor module is similar to that for a power semiconductor module by a conventional technique. In the method of manufacturing the power semiconductor module, first, the power semiconductor chip 1 is mounted on the stacked substrate 12, and the power semiconductor chip 1 and the electrode pattern 4 provided on the insulating substrate 2 are electrically connected by the lead frame interconnection 6. Next, these are bonded to the metal substrate 5 and a stacked assembly constituted by the power semiconductor chip 1, the stacked substrate 12, and the metal substrate 5 is assembled. The terminal case 7 is adhered to the stacked assembly by an adhesive such as silicone.

Next, the power semiconductor chip 1 and the metal terminal 9 are connected by the metal wire 10 and the terminal case 7 is filled with the sealing resin 8, which may be a hard resin such as an epoxy resin. Thus, the power semiconductor module according to the embodiment and FIG. 1 is completed. When the sealing resin 8 is not a hard resin such as an epoxy resin, a cover is provided so that the sealing resin 8 does not leak outside.

As described above, according to the semiconductor device of the embodiment, by setting the width of the bonding portions to be wider than the width of the interconnect portion, and connecting the interconnect portion and the bonding portions at a position away from the ends of the bonding portions, the concentration of stress applied to the end portions of the bonding portions of the lead frame interconnection consequent to thermal deformation may be mitigated. By mitigating the concentration of stress, even when the power semiconductor chip is repeatedly powered ON and OFF, the power semiconductor chip becomes resistant to destruction, enabling the lifespan of the power semiconductor module to be extended.

Further, the narrower the width of the interconnect portion is set, the longer the lifespan may be extended until the semiconductor chip fails. Therefore, in the semiconductor device of the embodiment, the width of the interconnect portion is made narrower than the width by which the lifespan targeted for the semiconductor device is achieved. For example, the width of the bonding portions is set to be 20% wider than the width of the interconnect portion, or more. As a result, the lifespan until the power semiconductor chip fails may be made longer than the targeted lifespan, enabling reliability of the semiconductor device to be ensured.

Further, by setting the width of the bonding portions to be 20% wider than the width of the interconnect portion or more, sloping of the lead frame interconnection occurring when the bonding member melts may be suppressed. Therefore, the thickness of the bonding portions may be stably formed and reliability of the semiconductor device may be ensured.

In a power semiconductor module structure that uses a lead frame interconnection between the semiconductor chip and the electrode pattern and that is further sealed by a resin, heat generated by the semiconductor chip during operation is transferred to the sealing resin by the lead frame interconnection. As a result, consequent to differences in thermal expansion of the semiconductor chip and the bonding member, the stacked substrate, the lead frame interconnection and the sealing resin, thermal deformation occurs near the semiconductor chip. Since the semiconductor chip is controlled to be repeatedly turned ON and OFF, repeated thermal deformation occurs. As a result, based on a reliability test, stress (strain) from the thermal deformation concentrates at the upper surface of the semiconductor chip at a bonding portion with the lead frame interconnection, causing semiconductor chip destruction.

Figure 8:
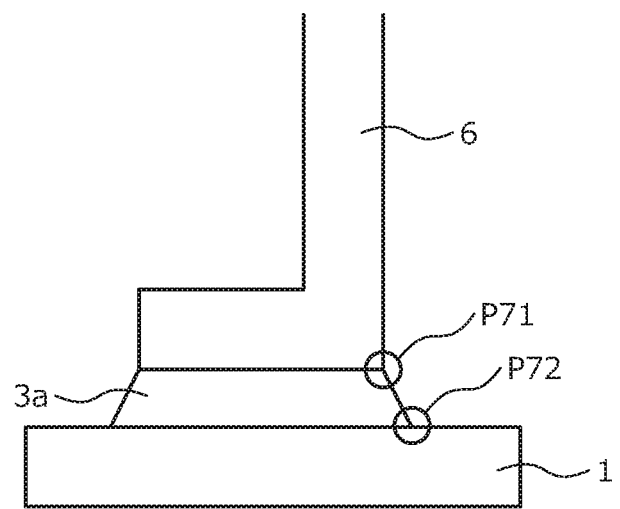
FIG. 8 is a cross-sectional view of a structure of a bonding portion of a lead frame interconnection having a conventional structure.

Semiconductor chip destruction will be described in detail. FIG. 8 is a cross-sectional view of a structure of a bonding portion of a lead frame interconnection having a conventional structure. In FIG. 8, the lead frame interconnection 6 is bonded to the power semiconductor chip 1 by the bonding member 3a. As depicted in FIG. 8, a lower bonding portion of the lead frame interconnection 6 has an L-shape. With the L-shape, a corner portion P71 has high rigidity. Therefore, at this portion, stress consequent to thermal deformation cannot be mitigated whereby the stress is transmitted to a portion P72 just beneath the corner portion P71 and the power semiconductor chip 1 is destroyed.

Further, for example, the lead frame interconnection is connected to the semiconductor chip using a bonding member such as solder. When solder is used for the bonding member, consequent to the surface tension when the solder is molten and the weight of the lead frame interconnection, the lead frame interconnection may be connected in a tilted manner. In this case, the thickness of the solder becomes uneven whereby stress concentrates consequent to temperature differences at the time of energization, reducing product life.

However, the semiconductor device and the method of manufacturing a semiconductor device of the present invention achieve an effect in that stress applied to the upper surface of the semiconductor element may be reduced and the lead frame interconnection may be stably connected.

As described, the semiconductor device and the method of manufacturing a semiconductor device of the present invention are useful for power semiconductor devices used in power converting equipment such as inverters, power supply devices such as in various industrial machines, and automotive inverters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a stacked assembly including:
        a metal substrate;
        a stacked substrate mounted on the metal substrate, the stacked substrate having an electrode pattern;
        a semiconductor element mounted on the stacked substrate; and
        a monolithic lead frame interconnection electrically connecting the semiconductor element and the electrode pattern, the lead frame interconnection including
            a first bonding portion that is a first plate, a bottom surface thereof being bonded to the semiconductor element by a first bonding member,
            a second bonding portion that is a second plate, a bottom surface thereof being bonded to the electrode pattern by a second bonding member, and
            an interconnect portion connecting the first and second bonding portions along a first direction, the interconnect portion being a bended rectangular plate, and having
                a first end extending from a side surface of the first plate,
                a second end extending from a side surface or a top surface of the second plate, and
                an n-shaped central portion that extends from, and connects, the first and second ends, wherein
            the first and second ends and the central portion of the interconnect portion are of a same width in a second direction perpendicular to the first direction, and
            a width of at least one of the first bonding portion and the second bonding portion in the second direction, is larger than the width of the first or second end of the interconnect portion.

2. The semiconductor device according to claim 1, wherein the interconnect portion is connected to one of the first and second bonding portions at a position away from an end of said one bonding portion.

3. The semiconductor device according to claim 1, wherein
    a threshold width of the interconnect portion is determinable by a targeted lifespan of the semiconductor device and at least one of a width of the first bonding portion and a width of the second bonding portion, and
    a width of the interconnect portion is set to be narrower than the threshold width.

4. The semiconductor device according claim 1, wherein said at least one bonding portion is at least 20% wider than the interconnect portion.

5. The semiconductor device according claim 1, wherein the semiconductor device includes a resin case adhered to the stacked assembly.

6. A method of manufacturing a semiconductor device, the method comprising:
    assembling a stacked assembly by
        mounting a semiconductor element on a stacked substrate and
        mounting the stacked substrate on a metal substrate, the stacked substrate having an electrode pattern;
    electrically connecting the semiconductor element and the electrode pattern using a monolithic lead frame interconnection having
        a first bonding portion that is a first plate,
        a second bonding portion that is a second plate, and
        an interconnect portion connecting the first and the second bonding portions along a first direction, the interconnect portion being a bended rectangular plate, and having
            a first end extending from a side surface of the first plate,
            a second end extending from a side surface or a top surface of the second plate, and
            an n-shaped central portion that extends from, and connects, the first and second ends, wherein
        a bottom surface of the first plate and a bottom surface of the second plate are respectively bonded to the semiconductor element and the electrode pattern by a first bonding member and a second bonding member,
        the first and second ends and the central portion of the interconnect portion are of a same width in a second direction perpendicular to the first direction, and
        a width of at least one of the first and second bonding portions in the second direction is larger than the width of the first or second end of the interconnect portion; and
    adhering a resin case to the stacked assembly.

* * * * *